(12) United States Patent
Wang

(10) Patent No.: US 10,761,629 B2
(45) Date of Patent: Sep. 1, 2020

(54) FLEXIBLE TOUCH DISPLAY PANEL AND MANUFACTURING METHOD THEREFOR, AND DISPLAY DEVICE

(71) Applicant: BOE TECHNOLOGY GROUP CO., LTD., Beijing (CN)

(72) Inventor: Ming Hsi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/329,724

(22) PCT Filed: May 15, 2018

(86) PCT No.: PCT/CN2018/086844
§ 371 (c)(1),
(2) Date: Feb. 28, 2019

(87) PCT Pub. No.: WO2018/219139
PCT Pub. Date: Dec. 6, 2018

(65) Prior Publication Data
US 2019/0243479 A1 Aug. 8, 2019

(30) Foreign Application Priority Data

May 27, 2017 (CN) .......................... 2017 1 0392162

(51) Int. Cl.
*G06F 3/041* (2006.01)
*G06F 3/045* (2006.01)
(Continued)

(52) U.S. Cl.
CPC ............ *G06F 3/041* (2013.01); *G06F 3/0412* (2013.01); *H01L 27/322* (2013.01);
(Continued)

(58) Field of Classification Search
CPC ............................... G06F 3/0412; G06F 3/044
See application file for complete search history.

(56) References Cited

U.S. PATENT DOCUMENTS

2012/0086665 A1* 4/2012 Song ................... G02F 1/13338
345/174
2014/0061597 A1* 3/2014 Choi ................... H01L 51/5284
257/40

FOREIGN PATENT DOCUMENTS

CN    103677433 A    3/2014
CN    104035621 A    9/2014
(Continued)

OTHER PUBLICATIONS

Chinese Office Action dated Apr. 1, 2019, from application No. 201710392162.8.
(Continued)

*Primary Examiner* — Nan-Ying Yang
(74) *Attorney, Agent, or Firm* — Foley & Lardner LLP

(57) ABSTRACT

A flexible touch display panel includes a flexible display substrate, and a color film layer disposed above the flexible display substrate. The color film layer includes a plurality of color filter blocks spaced apart, and a light shielding layer disposed between adjacent ones of the color filter blocks. The flexible touch display panel further includes a first electrode pattern and a second electrode pattern on both sides of the light shielding layer. An orthographic projection of the light shielding layer on the flexible display substrate covers orthographic projections of the first electrode patterns and the second electrode patterns on the flexible display substrate. The first electrode pattern is electrically connected with the second electrode pattern a via hole provided on the light shielding layer.

15 Claims, 1 Drawing Sheet

(51) Int. Cl.
*H01L 51/00* (2006.01)
*H01L 27/32* (2006.01)
*H01L 51/52* (2006.01)
*H01L 51/56* (2006.01)

(52) U.S. Cl.
CPC ........ *H01L 27/323* (2013.01); *H01L 51/0097* (2013.01); *H01L 51/5253* (2013.01); *H01L 51/5284* (2013.01); *H01L 51/56* (2013.01); *G06F 2203/04102* (2013.01); *G06F 2203/04103* (2013.01); *H01L 27/3276* (2013.01); *H01L 2251/5338* (2013.01)

(56) References Cited

FOREIGN PATENT DOCUMENTS

| | | | |
|---|---|---|---|
| CN | 204314846 U | 5/2015 | |
| CN | 104698700 A | 6/2015 | |
| CN | 105117075 A | 12/2015 | |
| CN | 106157818 A | 11/2016 | |
| CN | 106406607 A | 2/2017 | |
| CN | 107219953 A | 9/2017 | |
| KR | 101401053 B1 | 5/2014 | |
| TW | 201512958 A | 4/2015 | |
| WO | WO-2015/046769 A1 | 4/2015 | |
| WO | WO-2018/040735 A1 | 3/2018 | |

OTHER PUBLICATIONS

Chinese Office Action dated Jul. 19, 2019, from application No. 201710392162.8.
International Search Report and Written Opinion dated Aug. 1, 2018, from application No. PCT/CN2018/086844.

\* cited by examiner

FLEXIBLE TOUCH DISPLAY PANEL AND MANUFACTURING METHOD THEREFOR, AND DISPLAY DEVICE

CROSS REFERENCE OF RELATED APPLICATIONS

The present application is based upon International Application No. PCT/CN2018/086844, filed on May 15, 2018, which claims the priority of Chinese Patent Application No. 201710392162.8, filed on May 27, 2017, and the entire contents thereof are incorporated herein by reference as part of the present application.

TECHNICAL FIELD

The present disclosure relates to the technical field of displays, and in particular, to a flexible touch display panel, a manufacturing method thereof and a display device.

BACKGROUND

At present, a design requirement on a flexible touch display product is to implement a foldable function, which is convenient for carrying and is more desirable for a mobile display device such as a wearable device. The existing touch screen is limited by the process and the manufacturing cost, and there is no effective solution to achieve the foldable effect of the flexible touch screen.

It should be noted that the information disclosed in the Background section above is only for enhancing the understanding of the background of the present disclosure, and thus may include information that does not constitute prior art known to those of ordinary skill in the art.

SUMMARY

In one aspect, an arrangement of the present disclosure provides a flexible touch display panel. The flexible touch display panel includes a flexible display substrate, and a color film layer disposed above the flexible display substrate. The color film layer includes a plurality of color filter blocks spaced apart, and a light shielding layer disposed between adjacent ones of the color filter blocks. The flexible touch display panel further includes a metal grid electrode pattern and a strip bridge electrode pattern on both sides of the light shielding layer. An orthographic projection of the light shielding layer on the flexible display substrate covers orthographic projections of the metal grid electrode pattern and the strip bridge electrode pattern on the flexible display substrate. The metal grid electrode pattern includes a plurality of first electrodes and a plurality of second electrodes that are insulated from each other and intersecting each other. The strip bridge electrode pattern includes a plurality of strip bridge electrodes arranged in parallel, and one of the first electrode and the second electrode is electrically connected with the strip bridge electrode through a via hole provided on the light shielding layer.

The light shielding layer includes a plurality of first portions and a plurality of second portions. The first portions and the second portions intersect with each other to form a grid-like pattern. An orthographic projection of the first electrode on the flexible display substrate is covered by an orthographic projection of the first portion on the flexible display substrate. The second electrodes correspond to the strip bridge electrodes. Orthographic projections of the second electrode and the strip bridge electrode on the flexible display substrate are covered by an orthographic projection of the second portion on the flexible display substrate. Each of the second electrodes includes a plurality of electrode segments spaced apart. One first electrode is disposed between adjacent two of the electrode segments, and each of the electrode segments is electrically connected with the corresponding strip bridge electrodes through the via hole.

The light shielding layer includes a plurality of first portions and a plurality of second portions. The first portions and the second portions intersect with each other to form a grid-like pattern. The first electrodes correspond to the strip bridge electrodes. Orthographic projections of the first electrode and the strip bridge electrode on the flexible display substrate are covered by an orthographic projection of the first portion on the flexible display substrate. An orthographic projection of the second electrode on the flexible display substrate is covered by an orthographic projection of the second portion on the flexible display substrate. Each of the first electrodes includes a plurality of electrode segments spaced apart. One second electrode is disposed between two adjacent electrode segments, and each of the electrode segments is electrically connected with the corresponding strip bridge electrodes through the via hole.

The first electrode and the second electrode are a pair of a touch driving electrode and a touch sensing electrode for each other.

The flexible display panel includes: a flexible substrate, a plurality of display units disposed on the flexible substrate, and a thin film encapsulation covering the display units, and the color filter blocks correspond to the display units.

An area defined by adjacent ones of the first electrodes and adjacent ones of the second electrodes intersecting with the adjacent ones of the first electrodes contains one or more display units.

The display unit is a white light OLED display unit, or, a color of each color filter block is the same as a color displayed by each corresponding display unit.

In another aspect, an arrangement of the present disclosure provides a manufacturing method for a flexible touch display panel. The method includes forming a first one of a metal grid electrode pattern and a strip bridge electrode pattern on a flexible display substrate by a patterning process. The method includes forming a color film layer including a plurality of color filter blocks spaced apart and a light shielding layer formed between adjacent ones of the color filter blocks. An orthographic projection of the light shielding layer on the flexible display substrate covers an orthographic projection of the first one of the metal grid electrode pattern or strip bridge electrode pattern on the flexible display substrate. The method includes forming a second one of the metal grid electrode pattern and the strip bridge electrode pattern on the light shielding layer. The orthographic projection of the light shielding layer on the flexible display substrate covers an orthographic projection of the second one of the metal grid electrode pattern or strip bridge electrode pattern on the flexible display substrate. The metal grid electrode pattern includes a plurality of first electrodes and a plurality of second electrodes that are insulated from each other and intersecting each other. The strip bridge electrode pattern includes a plurality of strip bridge electrodes arranged in parallel. One of the first electrode and the second electrode is electrically connected with the strip bridge electrode through a via hole formed on the light shielding layer.

The flexible display panel includes a flexible substrate, a plurality of display units that are formed in sequence on the flexible substrate and a thin film encapsulation covering the display units. The formed color filter blocks correspond to the display units.

In yet another aspect, an arrangement of the present disclosure provides a display device that includes the flexible touch display panel described above.

This section provides an overview of various implementations or examples of the techniques described in the present disclosure, and is not a comprehensive disclosure of all scopes or all features of the disclosed technology.

BRIEF DESCRIPTION OF THE DRAWINGS

In order to more clearly illustrate the arrangements of the present disclosure or the technical solutions in the related art, the drawings used in the arrangements or the description of the related art will be briefly described below. Apparently, the drawings in the following description only illustrate some arrangements of the present disclosure, and other drawings can be obtained from these drawings by those skilled in the art without any creative effort.

DETAILED DESCRIPTION

Figure 1:
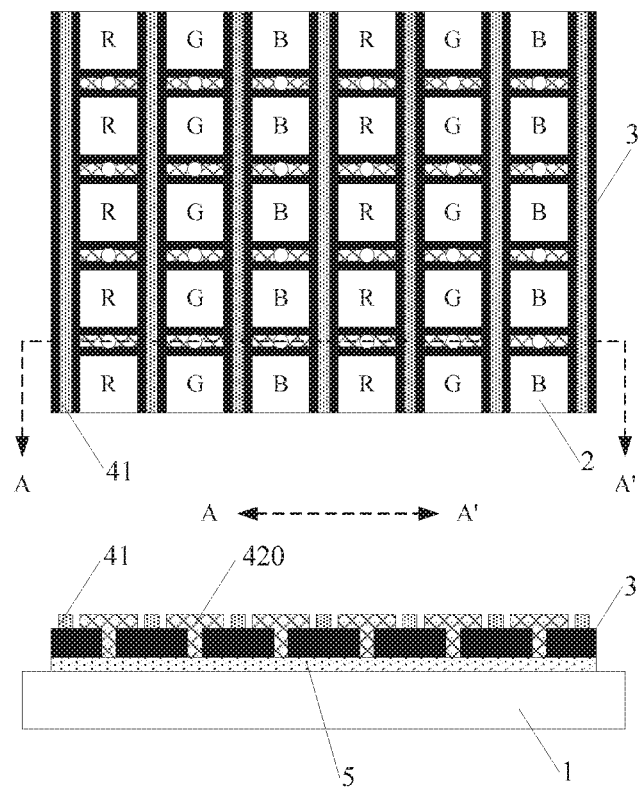
FIG. 1 is a top plan view of a flexible touch display panel and a first cross-sectional view along an A-A' direction of the flexible touch display panel according to an arrangement of the present disclosure.

The technical solutions in the arrangements of the present disclosure are clearly and completely described in the following with reference to the accompanying drawings in the arrangements of the present disclosure. Apparently, the described arrangements are only a part of the arrangements of the present disclosure, but not all of the arrangements. All other arrangements obtained by those skilled in the art based on the arrangements of the present disclosure without creative efforts fall within the scope of the present disclosure.

It is to be noted that all terms (including technical and scientific terms) used in the arrangements of the present disclosure have the same meaning as commonly understood by one of ordinary skill in the art to which the present disclosure belongs, unless otherwise defined. It should also be understood that terms such as those defined in the ordinary dictionary should be interpreted as having meanings consistent with their meaning in the context of the related art, and are not to be interpreted in terms of idealization or in extreme formality unless explicitly defined herein.

For example, the terms "first", "second", and similar terms used in the specification and claims of the present disclosure are not intended to indicate any order, quantity, or importance, and they are merely used to distinguish different components. The word "including" or "comprising", and the like, is intended to mean that the element or item that appears before the word covers the elements or items that appear after the word and their equivalents, without excluding other elements or items. The terms indicating orientation or position relationship such as "lateral", "longitudinal", "one side", and "the other side" is based on the orientation or position relationship shown in the drawings, and is merely for convenience of explanation of the technical solution of the present disclosure, rather than indicating or implying that the device or the component referred to must have a particular orientation, constructed and operated in a particular orientation, therefore, it is not to be construed as limiting the present disclosure.

Figure 2:
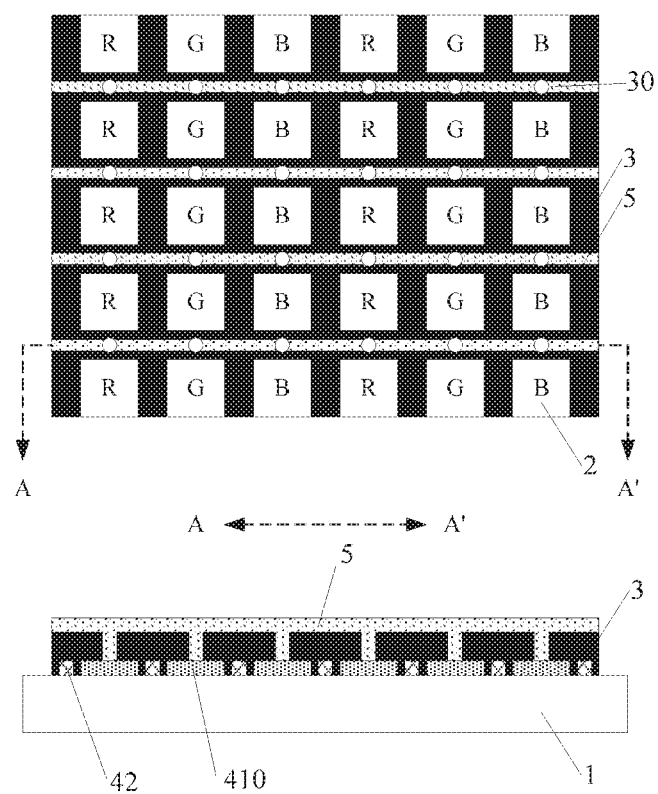
FIG. 2 is a top plan view of a flexible touch display panel and a second cross-sectional view along the A-A' direction of the flexible touch display panel according to an arrangement of the present disclosure.

As shown in FIG. 1 and FIG. 2, an arrangement of the present disclosure provides a flexible touch display panel. The flexible touch display panel includes a flexible display substrate 1 and a color filter (CF) layer disposed above the flexible display substrate 1. The color film layer includes a plurality of color filter blocks 2 spaced apart; and a light shielding layer 3 disposed between the color filter blocks 2. The flexible touch display panel further includes a metal grid electrode pattern and a strip bridge electrode pattern on both sides of the light shielding layer 3. An orthographic projection of the light shielding layer 3 on the flexible display substrate 1 covers orthographic projections of the metal grid electrode pattern and the strip bridge electrode pattern on the flexible display substrate 1. The metal grid electrode pattern includes a plurality of first electrodes 41 and a plurality of second electrodes 42 insulated from each other and intersecting each other. The strip bridge electrode pattern includes a plurality of strip bridge electrodes 5 arranged in parallel. One of the first electrode 41 and the second electrode 42 is electrically connected to the strip bridge electrode 5 through a via hole 30 provided on the light shielding layer 3.

It should be noted that, first, the first flexible substrate 1 specifically includes a flexible substrate, a plurality of display units disposed on the flexible substrate, and a thin film encapsulation (TFE) layer covering the display units. The color filter blocks 2 of various colors correspond to the display units.

The display unit includes an organic light-emitting display (OLED) device, and a Thin Film Transistor (TFT) for driving the OLED device to emit light. The details thereof may specifically refer to the related art, and will not be elaborated in the arrangement of the present disclosure.

Second, in the above flexible touch display panel provided by the arrangement of the present disclosure, the light transmittance of the color filter block 2 in the color film layer is higher than that of the polarizer film attached to the display surface of the display panel in the related art. In addition, the light shielding layer 3 disposed between the color filter blocks 2 can block the reflection of ambient light from a reflective element having a high light reflectance such as a metal trace between the display units in the flexible display substrate 1. Therefore, the color filter layer can have an anti-reflection function, while can ensure that the flexible touch display panel has excellent display brightness. Moreover, the color filter layer generally has a thickness smaller than that of the polarizer film in the related art, which is desirable for the flexible touch display panel to be folded.

As shown in FIG. 1 and FIG. 2, only an example in which the color filter blocks 2 include red (indicated by a letter R in the figures), green (indicated by a letter G in the figures), and blue (indicated by a letter B in the figures) blocks is described for illustration. However, the color filter blocks 2 may also include color filter blocks of other colors such as yellow. In addition, the arrangement of the color filter blocks 2 is not limited to the strip shaped array as illustrated in the figures, and may also be arranged in a form of mosaics, or in a triangle layout. The details thereof may specifically refer to the related art, and will not be elaborated in the arrangement of the present disclosure.

Third, the metal grid electrode pattern and the strip bridge electrode pattern located on both sides of the light shielding layer 3 may be the situation as shown in FIG. 1, that when the metal grid electrode pattern is disposed above the light shielding layer 3 (i.e., at a side away from the flexible display substrate 1), the strip bridge electrode pattern is disposed under the light shielding layer (i.e., between the light shielding layer 3 and the flexible display substrate 1). On the contrary, as shown in FIG. 2, when the metal grid electrode pattern is disposed under the light shielding layer 3, the strip bridge electrode pattern is disposed above the light shielding layer.

The light shielding layer 3 may specifically be formed of a black matrix (BM) material.

Fourth, in the metal grid electrode pattern described above, the plurality of first electrodes 41 and the plurality of second electrodes 42 which are insulated from each other and intersecting each other are all disposed at the same side of the light shielding layer 3 (i.e., both are disposed above or under the light shielding layer 3). Therefore, one electrode is disconnected with the other electrode at the intersection to avoid electrical connection between the two electrodes disposed in the same layer and affecting a touch signal.

Since one electrode is disconnected at the intersection with the other electrode, it is necessary to electrically connect them with the strip bridge electrode 5 disposed below or above through the via hole 30 on the light shielding layer 3. Thus, transmission of electrical signals between disconnected electrodes can be realized by a bridge through the via hole 30 on the light shielding layer 3 in a stack design.

Here, the first electrode 41 and the second electrode 42 are a pair of a touch driving electrode (briefly as Tx, that is, for receiving a driving signal of a touch) and a touch sensing electrode (briefly as Rx, that is, for receiving a sensing signal of a touch) for each other.

Fifth, the metal grid electrode pattern distribution may be a periodic or non-periodic arrangement. That is, an area defined by adjacent two first electrodes 41 and adjacent two second electrodes 42 intersecting the two first electrodes 41 may include one (as shown in FIG. 1 and FIG. 2) or more display units.

Based on the above, in the flexible touch display panel provided by the arrangement of the present disclosure, since the metal grid electrode pattern and the strip bridge electrode pattern having the above stacked design are both made of a metal material, the foldable function of the flexible touch display panel can be realized utilizing the good ductility characteristics of the metal. Moreover, since orthographic projections of the metal grid electrode pattern and the strip bridge electrode pattern on the flexible display substrate 1 are both covered by the orthographic projection of the light shielding layer 3 on the flexible display substrate 1, blocking of the metal pattern by the light shielding layer 3 can effectively reduce the extent to which these metal traces are perceived by human eyes, thus enabling the touch function without affecting the normal display.

In addition, since the preparation process of the flexible touch display panel has only a few modifications to the existing mass production process, the foldable and wearable functions of the flexible touch display product can be realized without significantly changing the mass production cost, thus achieving the effect of improving the value of the product.

Further specifically, referring to FIG. 1, the light shielding layer 3 includes a plurality of first portions (i.e., a longitudinal portion of the light shielding layer 3 in a direction perpendicular to the plane of the drawing) and a plurality of second portions (i.e., a lateral portion of the light shielding layer 3 in a left-to-right direction in the drawing). The first portion and the second portion intersect each other to form a grid-like pattern. An orthographic projection of the first electrode 41 on the flexible display substrate is covered by an orthographic projection of the first portion on the flexible display substrate. The second electrodes 42 correspond to the strip bridging electrodes 5 in one-to-one correspondence, and orthographic projections of the second electrode 42 and the strip bridge electrode 5 on the flexible display substrate are covered by an orthographic projection of the second portion on the flexible display substrate. Each of the second electrodes 42 includes a plurality of electrode segments 420 spaced apart, and one first electrode 41 is disposed between adjacent two electrode segments 420. Each electrode segment 420 and the corresponding strip bridge electrode 5 are electrically connected through the via hole 30.

Further specifically, referring to FIG. 2, the light shielding layer 3 includes a plurality of first portions (i.e., a lateral portion of the light shielding layer 3 in a left-to-right direction in the drawing) and a plurality of second portions (i.e., a longitudinal portion of the light shielding layer 3 in a direction perpendicular to the plane of the drawing). The first portion and the second portion intersect each other to form a grid-like pattern. The first electrode 41 correspond to the strip bridging electrodes 5 in one-to-one correspondence, and orthographic projections of the first electrode 41 and the strip bridge electrode 5 on the flexible display substrate are covered by an orthographic projection of the first portion on the flexible display substrate. An orthographic projection of the second electrode 42 on the flexible display substrate is covered by an orthographic projection of the second portion on the flexible display substrate. Each of the first electrodes 41 includes a plurality of electrode segments 410 spaced apart, and one second electrode 42 is disposed between adjacent two electrode segments 410. Each electrode segment 410 and the corresponding strip bridge electrode 5 are electrically connected through the via hole 30.

On the basis of the above, since the color film layer in the flexible touch display panel has anti-reflection function, the display unit in the flexible display substrate 1 may be a monochrome white OLED display unit. However, the display units may also be OLED display unit emitting various colors such as red, green, blue or the like, so long as the color of each color filter block is the same as the color displayed by each corresponding display unit.

Further, an arrangement of the present disclosure further provides a manufacturing method for the flexible touch display panel. The manufacturing method includes the following blocks.

In block S1: one of a metal grid electrode pattern and a strip bridge electrode pattern is formed on the flexible display substrate by a patterning process.

In block S2, a color film layer is formed, including a plurality of color filter blocks spaced apart and a light shielding layer formed between the color filter blocks, an orthographic projection of the light shielding layer on the flexible display substrate covering the previously formed metal grid electrode pattern or strip bridge electrode pattern.

In block S3, the other one of the metal grid electrode pattern and the strip bridge electrode pattern is formed on the light shielding layer, and the orthographic projection of the light shielding layer on the flexible display substrate covers the subsequently formed metal grid electrode pattern or strip bridge electrode pattern.

The formed metal grid electrode pattern includes a plurality of first electrodes and a plurality of second electrodes that are insulated from each other and intersecting each other. The formed strip bridge electrode pattern includes a plurality of strip bridge electrodes arranged in parallel. One of the first electrode and the second electrode formed and the formed strip bridge electrode are electrically connected through a via hole formed on the light shielding layer.

Here, the above-described patterning process is a process of processing a film layer to form a specific pattern. A typical patterning process is a process of exposing a photoresist, developing the photoresist, etching the film, and removing the photoresist with a mask.

Further, forming the flexible display panel includes providing a flexible substrate, and sequentially forming a plurality of display units and a thin film encapsulation layer covering the display units on the flexible substrate. The color filter blocks formed in the subsequent block (e.g., S2) correspond to the previously formed display units.

On the basis of the above, an arrangement of the present disclosure further provides a display device, including the above flexible touch display panel. The display device may specifically be an OLED display device, such as a display, a television, a digital photo frame, a mobile phone, a tablet computer, a digital photo frame, a navigator, and a smart bracelet with a display screen, and any product or component having a display function.

In view of the above, in the flexible touch display panel provided by the arrangement of the present disclosure, since the metal grid electrode pattern and the strip bridge electrode pattern having the above stacked design are both made of a metal material, the foldable function of the flexible touch display panel can be realized utilizing the good ductility characteristics of the metal. Moreover, since orthographic projections of the metal grid electrode pattern and the strip bridge electrode pattern on the flexible display substrate are both covered by the orthographic projection of the light shielding layer on the flexible display substrate, blocking of the metal pattern by the light shielding layer can effectively reduce the extent to which these metal traces are perceived by human eyes, thus enabling the touch function without affecting the normal display.

In addition, since the preparation process of the flexible touch display panel has only a few modifications to the existing mass production process, the foldable and wearable functions of the flexible touch display product can be realized without significantly changing the mass production cost, thus achieving the effect of improving the value of the product.

The above is only the specific arrangements of the present disclosure, but the scope of the present disclosure is not limited thereto, and modifications or substitutions easily conceived by any person skilled in the art within the technical scope of the present disclosure should be covered by the scope of the present disclosure. Therefore, the scope of the present disclosure should be determined by the scope of the appended claims.

What is claimed is:

1. A flexible touch display panel, comprising: a flexible display substrate; and a color film layer disposed above the flexible display substrate, the color film layer comprising a plurality of color filter blocks spaced apart, and a light shielding layer disposed between adjacent ones of the plurality of color filter blocks, wherein the flexible touch display panel further comprises:
    a first electrode pattern and a second electrode pattern on both sides of the light shielding layer, wherein an orthographic projection of the light shielding layer on the flexible display substrate covers orthographic projections of the first electrode pattern and the second electrode pattern on the flexible display substrate, and wherein the first electrode pattern is electrically connected with the second electrode pattern through a via hole provided in the light shielding layer without contacting color filter blocks,
    wherein the first electrode pattern and the second electrode pattern are formed of metal,
    the first electrode pattern comprises a plurality of first electrodes and a plurality of second electrodes that are insulated from each other and intersect with each other to form touch electrodes,
    the second electrode pattern comprises a plurality of strip bridge electrodes arranged in parallel, and
    one of the plurality of first electrodes and the plurality of second electrodes is electrically connected with one of the plurality of strip bridge electrodes through the via hole provided in the light shielding layer.

2. The flexible touch display panel according to claim 1, wherein the light shielding layer comprises a plurality of first portions and a plurality of second portions, the first portions and the second portions intersecting with each other to form a grid-like pattern,
    an orthographic projection of each of the plurality of first electrodes on the flexible display substrate is covered by an orthographic projection of one of plurality of the first portions on the flexible display substrate,
    the second electrodes correspond to the strip bridge electrodes, and orthographic projections of the second electrodes and the strip bridge electrodes on the flexible display substrate are covered by orthographic projections of the second portions on the flexible display substrate, and
    wherein each of the second electrodes comprises a plurality of electrode segments spaced apart, one of the plurality of first electrodes is disposed between adjacent ones of the plurality of electrode segments, and each of the electrode segments is electrically connected with the corresponding strip bridge electrodes through the via hole.

3. The flexible touch display panel according to claim 1, wherein the light shielding layer comprises a plurality of first portions and a plurality of second portions, the first portions and the second portions intersecting with each other to form a grid-like pattern,
    the first electrodes correspond to the strip bridge electrodes, and orthographic projections of the first electrodes and the strip bridge electrodes on the flexible display substrate are covered by orthographic projections of the first portions on the flexible display substrate,
    an orthographic projection of each of the plurality of second electrodes on the flexible display substrate is covered by an orthographic projection of one of the plurality of second portions on the flexible display substrate, and
    wherein each of the first electrodes comprises a plurality of electrode segments spaced apart, one of the plurality of second electrodes is disposed between adjacent ones of the plurality of electrode segments, and each of the electrode segments is electrically connected with the corresponding strip bridge electrodes through the via hole.

4. The flexible touch display panel according to claim 1, wherein the first electrode and the second electrode are a pair of a touch driving electrode and a touch sensing electrode.

5. The flexible touch display panel according to claim 1, wherein the flexible display panel comprises: a flexible substrate, a plurality of display units disposed on the flexible substrate, and a thin film encapsulation covering the display units, and the color filter blocks correspond to the display units.

6. The flexible touch display panel according to claim 5, wherein an area defined by adjacent ones of the plurality of first electrodes and adjacent ones of the plurality of second electrodes intersecting the adjacent ones of the plurality of first electrodes contains one or more display units.

7. The flexible touch display panel according to claim 5, wherein the display unit is a white light OLED display unit, or, a color of each color filter block is identical to a color displayed by each corresponding display unit.

8. A manufacturing method for a flexible touch display panel, comprising:

forming a first electrode pattern on a flexible display substrate by a patterning process;

forming a color film layer comprising a plurality of color filter blocks spaced apart and a light shielding layer formed between adjacent ones of the plurality of color filter blocks, an orthographic projection of the light shielding layer on the flexible display substrate covering an orthographic projection of the first electrode pattern on the flexible display substrate; and forming a second electrode pattern on the light shielding layer, the orthographic projection of the light shielding layer on the flexible display substrate covering an orthographic projection of the second electrode pattern on the flexible display substrate, wherein the first electrode pattern is electrically connected with the second electrode pattern through a via hole formed in the light shielding layer without contacting color filter blocks, wherein the first electrode pattern and the second electrode pattern are formed of metal, and wherein:

the first electrode pattern comprises a plurality of first electrodes and a plurality of second electrodes that are insulated from each other and intersect with each other to form touch electrodes, the second bridge electrode pattern comprises a plurality of strip bridge electrodes arranged in parallel, and one of the plurality of first electrodes and the plurality of second electrodes is electrically connected with one of the plurality of strip bridge electrodes through a via hole formed in the light shielding layer, or, wherein the second electrode pattern comprises a plurality of first electrodes and a plurality of second electrodes that are insulated from each other and intersect with each other to form touch electrodes, the first electrode pattern comprises a plurality of strip bridge electrodes arranged in parallel, and one of the plurality of first electrodes and the plurality of second electrodes is electrically connected with one of the plurality of strip bridge electrodes through the via hole formed in the light shielding layer.

9. The manufacturing method according to claim 8, wherein the light shielding layer comprises a plurality of first portions and a plurality of second portions, the first portions and the second portions intersecting with each other to form a grid-like pattern, an orthographic projection of each of the plurality of first electrodes on the flexible display substrate is covered by an orthographic projection of one the plurality of first portions on the flexible display substrate, the second electrodes correspond to the strip bridge electrodes, and orthographic projections of the second electrode and the strip bridge electrode on the flexible display substrate are covered by an orthographic projection of one of the plurality of second portions on the flexible display substrate, and wherein each of the second electrodes comprises a plurality of electrode segments spaced apart, one first electrode is disposed between adjacent ones of the electrode segments, and each of the electrode segments is electrically connected with the corresponding strip bridge electrodes through the via hole.

10. The manufacturing method according to claim 8, wherein the light shielding layer comprises a plurality of first portions and a plurality of second portions, the first portion and the second portion intersecting each other to form a grid-like pattern, the first electrodes correspond to the strip bridge electrodes, and orthographic projections of the first electrode and the strip bridge electrode on the flexible display substrate are covered by an orthographic projection of one of the plurality of first portions on the flexible display substrate, an orthographic projection of each of the plurality of second electrodes on the flexible display substrate is covered by an orthographic projection of one of the plurality of second portions on the flexible display substrate, and wherein each of the first electrodes comprises a plurality of electrode segments spaced apart, one second electrode is disposed between adjacent ones of the electrode segments, and each of the electrode segments is electrically connected with the corresponding strip bridge electrodes through the via hole.

11. The manufacturing method according to claim 8, wherein the first electrode and the second electrode are a pair of a touch driving electrode and a touch sensing electrode.

12. The manufacturing method according to claim 8, wherein the flexible display panel comprises: a flexible substrate, a plurality of display units that are formed in sequence on the flexible substrate and a thin film encapsulation covering the display units, and the formed color filter blocks correspond to the display units.

13. The manufacturing method according to claim 12, wherein an area defined by adjacent ones of the first electrodes and adjacent ones of the second electrodes intersecting the adjacent ones of the first electrodes contains one or more display units.

14. The manufacturing method according to claim 12, wherein the display unit is a white light OLED display unit, or, a color of each color filter block is the same as a color displayed by each corresponding display unit.

15. A display device, comprising the flexible touch display panel according to claim 1.

* * * * *